(12) United States Patent
An et al.

(10) Patent No.: US 11,006,496 B2
(45) Date of Patent: May 11, 2021

(54) LED LAMP WITH CURRENT-REGULATED WARM DIMMING

(71) Applicant: Shanghai Qiangling Electronic Co., Ltd., Shanghai (CN)

(72) Inventors: Pusong An, Shanghai (CN); Wenwen Liu, Shanghai (CN); Ming Chen, Shanghai (CN); Liu Yi, Shanghai (CN)

(\*) Notice: Subject to any disclaimer, the term of this patent is extended or adjusted under 35 U.S.C. 154(b) by 0 days.

(21) Appl. No.: 16/689,030

(22) Filed: Nov. 19, 2019

(65) Prior Publication Data

US 2020/0154545 A1 May 14, 2020

(51) Int. Cl.
| | |
|---|---|
| *H05B 45/3577* | (2020.01) |
| *F21K 9/278* | (2016.01) |
| *F21K 9/64* | (2016.01) |
| *H05B 45/395* | (2020.01) |
| *H05B 45/20* | (2020.01) |
| *H05B 45/10* | (2020.01) |
| *H01L 25/16* | (2006.01) |
| *F21Y 109/00* | (2016.01) |
| *F21Y 113/13* | (2016.01) |
| *F21K 9/232* | (2016.01) |
| *F21Y 115/10* | (2016.01) |

(52) U.S. Cl.
CPC ......... *H05B 45/3577* (2020.01); *F21K 9/278* (2016.08); *F21K 9/64* (2016.08); *H01L 25/167* (2013.01); *H05B 45/10* (2020.01); *H05B 45/20* (2020.01); *H05B 45/395* (2020.01); *F21K 9/232* (2016.08); *F21Y 2109/00* (2016.08); *F21Y 2113/13* (2016.08); *F21Y 2115/10* (2016.08)

(58) Field of Classification Search
CPC ....... F21K 9/232; F21K 9/238; H01L 25/075; H01L 33/60; H01L 33/50; H01L 33/56; H01L 33/62; F21V 29/83; H05B 33/08
See application file for complete search history.

(56) References Cited

U.S. PATENT DOCUMENTS

| | | | |
|---|---|---|---|
| 9,653,668 B2 | 5/2017 | Chung et al. | |
| 10,260,683 B2* | 4/2019 | Bergmann | ............. H05B 45/20 |
| 2013/0063035 A1* | 3/2013 | Baddela | ............. H05B 45/3577 |
| | | | 315/192 |
| 2015/0085489 A1* | 3/2015 | Anderson | ............... F21K 9/232 |
| | | | 362/249.06 |
| 2017/0016582 A1 | 1/2017 | Yang et al. | |
| 2019/0086037 A1* | 3/2019 | Cairns | ..................... F21K 9/232 |

\* cited by examiner

*Primary Examiner* — Daniel D Chang
(74) *Attorney, Agent, or Firm* — Kraguljac Law Group, LLC (57) ABSTRACT

In one embodiment, a filament for LED filament lamp is presented, that includes a light-transmissive substrate; at least one LED die mounted on the light-transmissive substrate; and at least one current regulator mounted on the light-transmissive substrate, wherein the current regulator is connected in series with the at least one LED. In another embodiment, an LED filament lamp is presented, that includes a dimmable LED driver circuit; a first channel LED array with at least two LED die and a first forward voltage drop; and a second channel LED array with at least one LED dies and at least one current regulator to cause a second forward voltage drop of the second channel LED array to increase as current through the second channel LED array increases, wherein the second channel LED array is connected in parallel with the first channel LED array.

20 Claims, 5 Drawing Sheets

Constant Current Dimmable LED Lamp Circuit

FIG. 5A

Linear Control Dimmable LED Lamp Circuit

FIG. 5B

LED LAMP WITH CURRENT-REGULATED WARM DIMMING

TECHNICAL FIELD

This application generally relates to light emitting diode ("LED") lamps, methods of manufacturing such lamps, and methods for controlling the color temperature of light emitted from such lamps. More specifically, this disclosure relates to current regulating features and methods for use with filament-style LED lamps to regulate the color temperature of light emitted from the lamp during dimming of an LED lamp.

BACKGROUND OF THE INVENTION

Due to a variety of factors, manufacturers of goods and consumers alike are increasingly pursuing energy efficient products. Such trends are evident in the lighting industry, where manufacturers are allocating much time and resource to developing energy efficient lighting to meet consumer demand for such products. Over the last few years, LED lighting technology has emerged as a leading technology for energy efficient lighting products. LED lighting devices are versatile, operate at low temperatures, easy to install and maintain, have long service lives, and increasingly provide many of the convenient features of more established lighting technologies, such as providing a variety or color temperatures and the ability to dim LED lamps.

BRIEF DESCRIPTION OF THE DRAWINGS

The accompanying drawings, which are incorporated in and constitute a part of the specification, illustrate various systems, methods, parts and arrangements of parts, and other embodiments of the invention.

DETAILED DESCRIPTION OF THE INVENTION

Certain terminology is used herein for convenience only and is not to be taken as a limitation on the present invention. Relative language used herein is best understood with reference to the drawings, in which like numerals are used to identify like or similar items. Further, in the drawings, certain features may be shown in somewhat schematic form.

LED lamp color temperatures typically range from what is referred to in the industry as "warm white" (with a correlated color temperature (CCT) of about 1800 Kelvin to 3000 Kelvin) to "natural white" (with a CCT of about 4000 Kelvin to 5000 Kelvin) to "cool white" (with a CCT of about 5500 Kelvin to 6500 Kelvin). LED lamp technology has advanced such that it is now common that LED lamps can utilize existing dimming switches commonly installed in homes. In addition, manufacturers are increasingly focusing on aesthetics and style of LED lamps. For example, filament-style LED lamps have gained in popularity. A filament-style LED lamp is designed to replicate the appearance of a traditional incandescent light bulbs, with "filaments" (which each include a plurality of diodes that emit light).

However, from a consumer's perspective, the performance of current LED lamps with regard to the combination of color temperature and dimming of the LED lamp can appear inferior to the performance of established lighting technologies. Such consumer perception may be due to the fact that consumers have grown accustomed to the behavior of established lighting technologies, which exhibit a shift in color temperature toward "warmer" light as the light is dimmed. Such a warmer color temperature shift as the light is dimmed may be referred to as "warm dimming." Established, low-efficiency lighting devices such as incandescent and halogen lamps inherently exhibit warm dimming characteristics; however, conventional LED lamps typically maintain their color temperature over their entire dimming range.

Conventional methods for approximating warm dimming in LED lamps; have substantial disadvantages. Conventional warm dimming LED lamps use a dimmable LED driver circuit with a two-channel dimming circuit to blend warm light from LEDs positioned on a first channel with cooler light from LEDs positioned on a second channel. LED driver circuits of this type are substantially more complex than standard dimmable LED driver circuits, which can make them more expensive, challenging to design, and difficult to manufacture.

Furthermore, two-channel dimming drivers are bulky, making it difficult to position the entire driver within the base of certain LED lamps, such as a filament-style LED lamp. Additionally, a two-channel dimming driver requires three electrical leads from the LED driver circuit to the output LEDs: one common lead and an additional lead for each channel. The process for installing and sealing three leads in a filament-style LED lamp is complicated, and typically has a relatively high defect rate, which adversely affects cost and quality.

Therefore, a novel LED lamp capable of warm dimming that solves such problems is needed and desirable for the LED lighting industry.

Embodiments of the present invention solve the problems identified above by providing various arrangements of assemblies of a plurality of light emitting diodes (also referred to as "LED dies") and a non-light-emitting current regulator mounted on a substrate. Such diode, current regulator, and substrate assemblies can be configured as a filament for use in an LED filament lamp to create parallel dimming channels across terminals of a one-channel dimmable LED driver circuit. The parallel dimming channels can be arranged to illuminate in sequence. The parallel dimming channels, when emitting light of two different correlated color temperatures, cause a warm dimming effect without requiring additional driver circuitry or additional conductive leads through the lamp.

Figure 1:
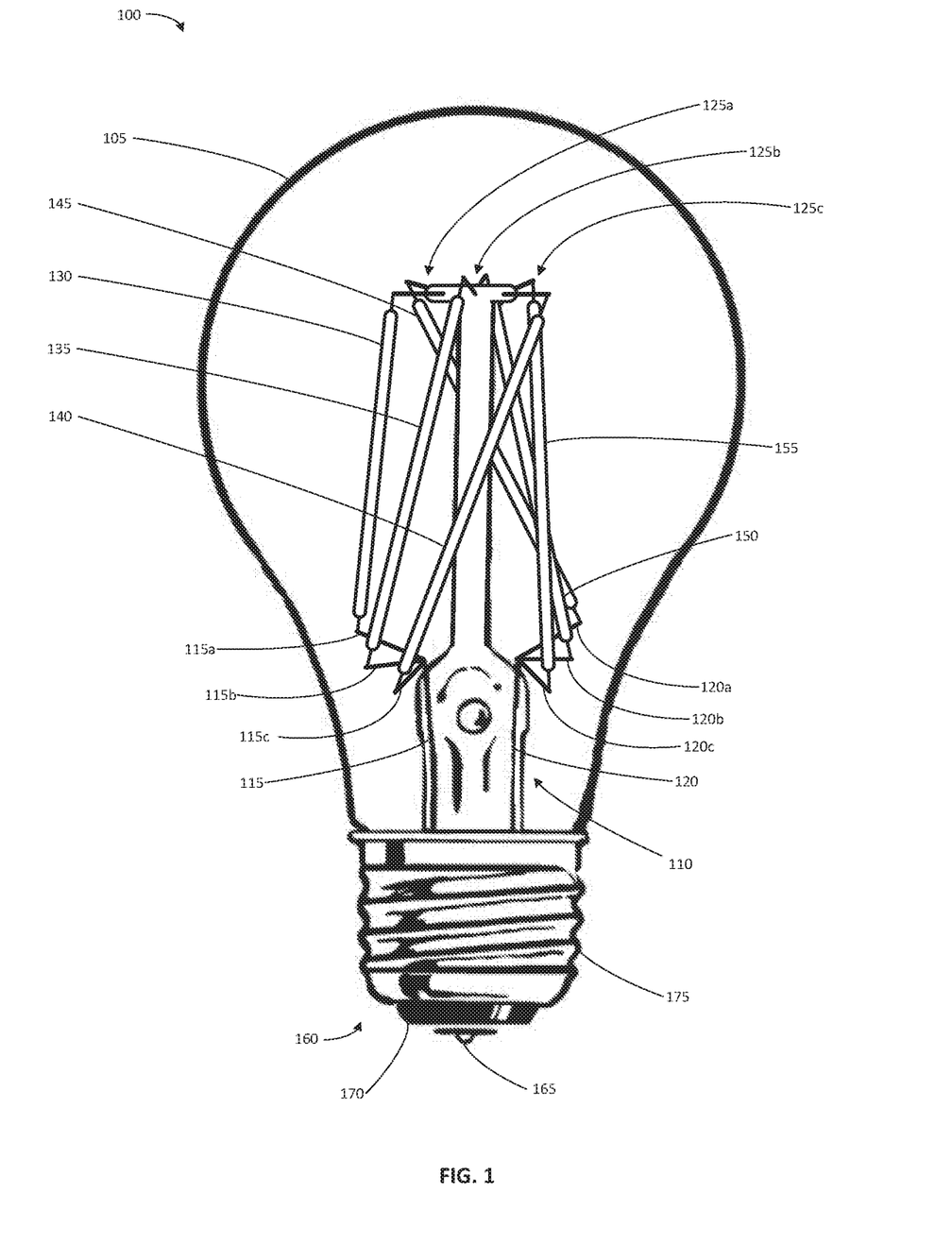
FIG. 1 illustrates a schematic view of an LED filament lamp according to one embodiment of the invention.

FIG. 1 illustrates a schematic view of an LED filament lamp 100 according to one embodiment of the invention. LED filament lamp 100 includes a transparent or translucent envelope 105 that defines a cavity. As illustrated, translucent envelope 105 is an A-lamp, but other lamp form factors are equally acceptable, including, but not limited to reflector lamps, PAR lamps, tubular lamps, and decorative lamps such as candle lamps. Envelope 105 may be made, for example, of glass or plastic and be transparent, frosted, or have a soft white coating.

LED filament lamp 100 includes a support mount 110 that extends into the cavity along an axis of the envelope 105. Support mount 110 may be made of the same material as the envelope 105. A support mount 110 may be sealed to envelope 105 in an airtight seal. The sealed envelope 105 may contain a gas mixture selected to dissipate heat generated within the envelope.

A first conductive lead 115 extends through support mount 110 to connect a positive terminal of a dimmable LED driver circuit (not illustrated in FIG. 1) to a series of first conductive supports 115a-115c. A second conductive lead 120 extends through the support mount 110 to connect a negative terminal of the dimmable LED driver circuit to a series of second conductive supports 120a-120c. First conductive supports 115a-115c and second conductive supports 120a-120c are supported by support mount 110 and extend outward into the cavity.

A series of upper conductive supports 125a-125c pass through support mount 110 at an end of the support mount 110 that is distal to the end where the first 115 and second 120 conductive leads extend through the support mount 110, and extend outward into the cavity. In one embodiment, upper conductive supports 125a-125c are electrically insulated from each other.

The LED filament lamp includes six LED filaments. Three LED filaments 130, 135, and 140 extend respectively between first conductive supports 115a-115c and upper conductive supports 125a-125c. The anode of LED filament 130 is conductively and mechanically attached to a distal end of first conductive support 115a, and the cathode of LED filament 130 is conductively and mechanically attached to a first end of upper conductive support 125a. LED filament 135 is similarly attached between first conductive support 115b and upper conductive support 125b, and LED filament 140 is similarly attached between first conductive support 115c and upper conductive supports 125c.

Three LED filaments 145, 150, and 155 extend respectively between upper conductive supports 125a-125c and second conductive supports 120a-120c. The anode of LED filament 145 is conductively and mechanically attached to first end of upper conductive support 125a and the cathode of LED filament 145 is conductively and mechanically attached to a distal end of second conductive support 120a. LED filament 150 is similarly attached between upper conductive support 125b and second conductive support 120b, and LED filament 155 is similarly attached between upper conductive supports 125c and second conductive support 120c.

The connections of the six LED filaments (130, 135, 140, 145, 150, and 155) described and illustrated, form three parallel LED arrays between the positive and negative terminals of the dimmable LED driver circuit (i.e., parallel LED arrays formed by LED filaments 130 and 145, LED filaments 135 and 150, and LED filaments 140 and 155).

A base cap 160 is affixed to the base of LED filament lamp 100. In the embodiment shown, the base cap 160 is an Edison-type cap with a foot contact 165 separated by insulation 170 from a screw thread contact 175. In other embodiments, other base types may be used, such as bayonet, GU, prong, and pin bases. In one embodiment, the dimmable LED driver circuit is concealed within base cap 160, and the hot and ground power supply leads for the dimmable LED driver circuit are connected to the foot contact 165 and screw contact 175, respectively.

Figure 2A:
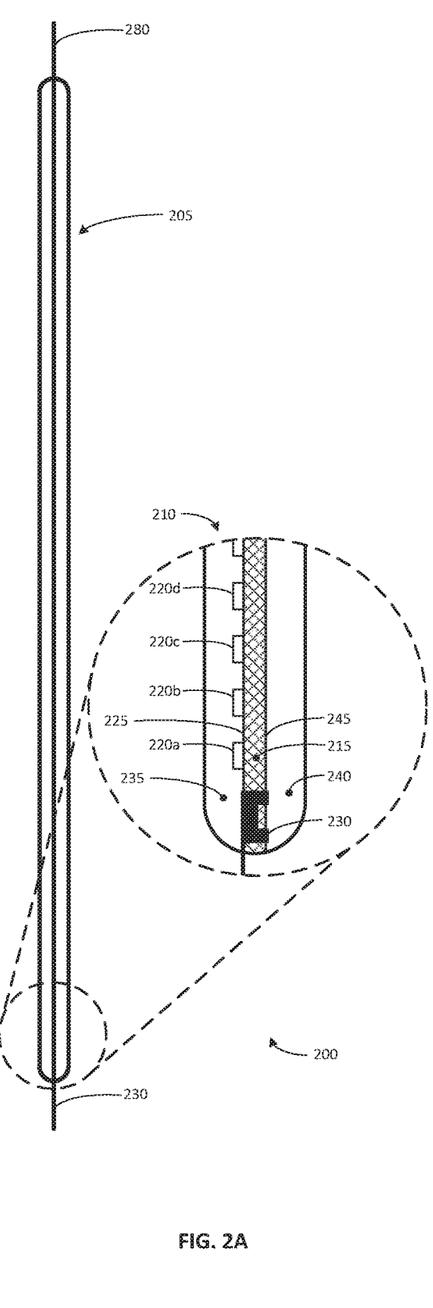
FIG. 2A illustrates a side view of an LED filament without onboard current regulation according to one embodiment of the invention with an inset magnified cross-section diagram.

FIG. 2A illustrates a side view 200 of an LED filament 205 in according to one embodiment of the invention. The LED filament 205 is without onboard current regulation. FIG. 2A further includes an inset magnified cross-section diagram 210 of the cathode end of LED filament 205.

LED filament 205 includes a substrate 215 with multiple LED dies 220a-220d placed on a first face 225 of the substrate 215. LED filament 205 also includes a first conductive terminal 230 at the cathode end and a second conductive terminal 280 at the anode end. A first adhesive bead 235 covers the first face 225 of the substrate 215 and the LED dies 220a-220d. A second adhesive bead 240 covers a second face 245 of the substrate 215.

LED dies 220a-220d may each be, for example, a 3 volt LED die. It will be understood that LED dies of smaller or larger voltage can be used with the embodiments disclosed herein. Although only four LED dies 220a-220d are illustrated in FIG. 2A, it will be understood that such illustration is for clarity and convenience and that substrate 215 can be arranged any number of LED dies. In one example, approximately 24 LED dies are placed on substrate 215. In another example, up to approximately 36 LED dies are placed on substrate 215. The number of LED dies is only practically limited by the ability to fit LED dies on a substrate of a length short enough to fit within an LED lamp, and the ability to dissipate the heat generated by the dies.

Substrate 215 may be formed of a transparent or translucent material, such as transparent ceramic, glass, or sapphire to allow light to pass through the substrate 215. Further, substrate 215 may be formed of layers of transparent or translucent material bonded together or affixed together, for example with a translucent or transparent adhesive. Alternatively, the substrate 215 may formed of opaque material, such as fiberglass, non-transparent ceramic, or metal-core substrate. Where the substrate 215 is opaque, through holes may be placed in the substrate 215 between the LED dies 220a-220d to allow light to pass through the substrate 215.

The first adhesive bead 235 and the second adhesive bead 240 are made up of a mixture including fluorescent particles dispersed in an adhesive that is clear when cured or dry. Suitable adhesives include, but are not limited to epoxy resin, silica gel, methyl silicone resin, phenyl silicone resin, methyl phenyl silicone resin, or modified silicone resin. The fluorescent powders may be selected from those that fluoresce in response to the light emitted by the LED dies 220a-220d.

The fluorescent powders fluoresce with different colors and may be blended in order to emit light that, in combination with the light emitted by the LED dies 220a-220d, cause LED filament 205 to emit light of a predetermined color temperature. In one embodiment, the fluorescent powders are selected to cause LED filament 205 to emit natural white light, that is light with a CCT in the range of 4000 Kelvin to 5000 Kelvin. In a specific example, the LED filament 205 emits light with a CCT of 4000 Kelvin, which is slightly to the warm side of the CCT spectrum. In another embodiment, the fluorescent powders are selected to cause LED filament 205 to emit a warm white light, for example, light with a CCT of 1800 Kelvin, which is a deeply warm white light similar to that given off by a candle. In yet another embodiment, the fluorescent powders are selected to cause LED filament 205 to emit a cool white light, for example, light with a CCT of 5600 Kelvin, which is similar to noon daylight. Other fluorescent powder blends may be used to cause LED filament 205 to emit light with practically any CCT. Further, light from LED filaments that emit light with two different CCT's can be blended to create light in a third CCT.

Figure 2B:
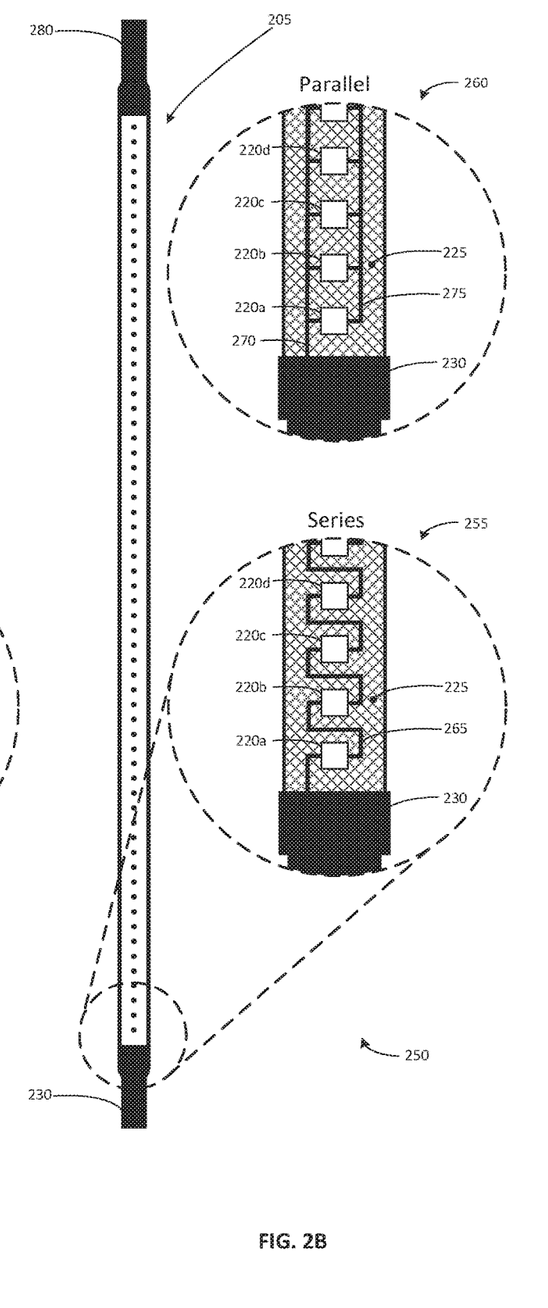
FIG. 2B illustrates a top view of an LED filament without onboard current regulation according to one embodiment of the invention with inset magnified cut-away diagrams.

FIG. 2B illustrates a top view 250 of the LED filament 205 without onboard current regulation according to certain embodiments of the invention, with inset magnified cutaway diagrams 255 and 260 of the cathode end of the LED filament 205 illustrating two alternative arrangements for LED dies. Magnified cutaway diagram 255 illustrates a first embodiment, where the LED dies 220a-220d are connected in series by one or more conductive traces such as conductive trace 265 on the first face 225 of substrate 215. Magnified cutaway diagram 260 illustrates a second embodiment, where the LED dies 220a-200d are connected in parallel by a first conductive trace 270 and a second conductive trace 275 on the first face 225 of substrate 215. First 230 and second 280 conductive terminals (as applicable to both embodiments illustrated in cut away diagrams 255 and 260) are affixed to substrate 215 (for example by crimping, riveting, soldering, or welding). In the series configuration of the LED filament 205 illustrated in cut away diagram 255, at the cathode end of the LED filament 205, first conductive terminal 230 is conductively connected by a conductive trace to the cathode of LED die 220a (i.e., the first LED die in the series with respect to the cathode end of the LED filament 205); and at the anode end of the LED filament 205, a second conductive terminal 280 is conductively connected by a conductive trace to the anode of the LED die in the series positioned at the end of the series (i.e., the last LED die in the series with respect to the cathode end of the LED filament 205).

In the parallel configuration of the LED filament 205 illustrated in cut away diagram 260, at the cathode end, the first conductive terminal 230 is conductively connected by conductive trace 270 to the cathodes of all LED dies 220a-220d (and all additional LED dies not illustrated); and at the anode end, the second conductive terminal 280 is conductively connected by conductive trace 275 to the anodes of all LED dies 220a-220d (and all additional LED dies not illustrated).

Figure 3A:
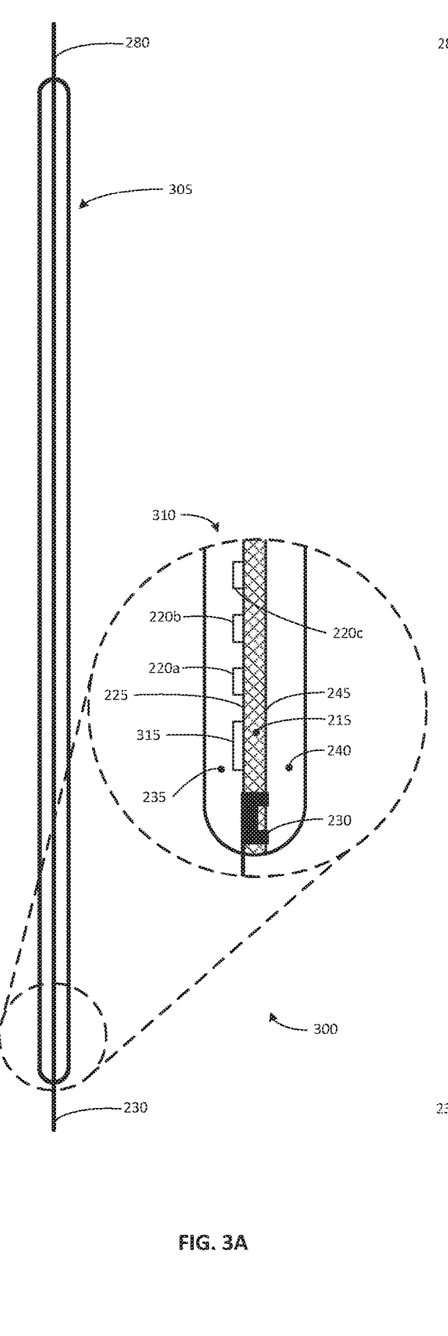
FIG. 3A illustrates a side view of a current-regulated LED filament with onboard current regulation according to one embodiment of the invention with an inset magnified cross-section diagram.

FIG. 3A illustrates a side view 300 of a current-regulated LED filament 305 according to one embodiment of the invention, that is, a LED filament with onboard current regulation. FIG. 3A includes an inset magnified cross-section diagram 310 of the cathode end of current-regulated LED filament 305. The construction of current-regulated LED filament 305 is similar to that of LED filament 205. Current-regulated LED filament 305 includes a substrate 215, with multiple LED dies 220a-220d placed on a first face 225 of the substrate 215, which can be connected in series or in parallel by conductive traces (as illustrated in cutaway diagrams 355 and 360). As with the LED filament 205, a first conductive terminal 230 is affixed to the cathode end of the current-regulated LED filament 305, and a second conductive terminal 280 is affixed to the anode end of the current-regulated LED filament 305. First and second adhesive beads 235, 240 cover the first face 225 and the second face 245 of the substrate 215, respectively. Current-regulated LED filament 305 further includes a current regulator 315 placed on the first surface 225 of the substrate 215. In another embodiment, current regulator 315 may be placed on the second surface 245 of the substrate 215 or any other location that is convenient for its utilization. For example, in a further embodiment, current regulator 315 may be located other than on the substrate, such as, for example, between conductive terminal 230 and a conductive support described with reference to FIG. 1.

Figure 3B:
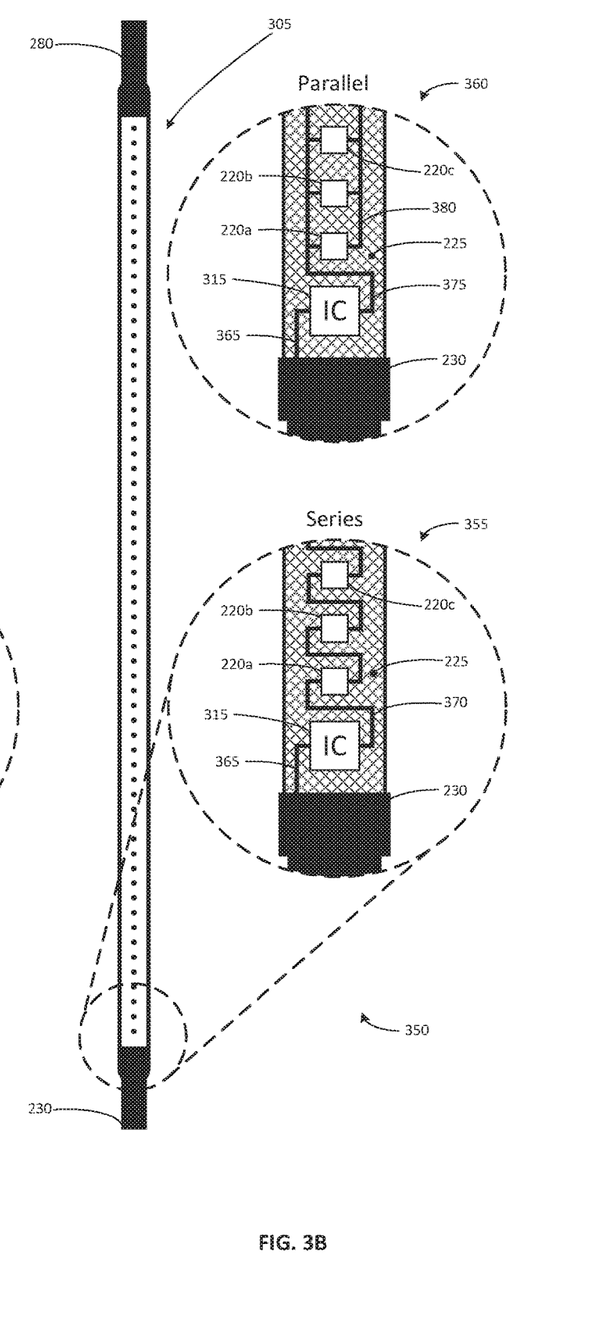
FIG. 3B illustrates a top view of a current-regulated LED filament with onboard current regulation according to one embodiment of the invention with inset magnified cutaway diagrams.

FIG. 3B illustrates a top view 350 of the current-regulated LED filament 305 according to certain embodiment of the invention, with inset magnified cutaway diagrams 355 and 360 of the cathode end of current-regulated LED filament 305 illustrating two alternative arrangements for LED dies. In both embodiments, the cathode of the current regulator 315 is connected to the first conductive terminal 230 at the cathode end of the current-regulated LED filament 305 by conductive trace 365. Magnified cutaway diagram 355 illustrates an embodiment having the LED dies 220a-220d of the current-regulated LED filament 305 connected in series. Here, the anode of the current regulator 315 is connected to the cathode of LED die 220a by conductive trace 370. Similar to the LED filament 205, at the anode end of the current-regulated LED filament 305, a second conductive terminal 280 is conductively connected by a conductive trace to the anode of the LED die in the series positioned at the end of the series. Magnified cutaway diagram 360 illustrates an embodiment where the LED dies 220a-220d of current-regulated LED filament 305 are connected in parallel. Here, the anode of the current regulator 315 is connected to the cathodes of all LED dies 220a-220d (and all additional LED dies not illustrated) by conductive trace 375. Similar to the LED filament 205, at the anode end of the current-regulated LED filament 305, the second conductive terminal 280 is conductively connected by conductive trace 380 to the anodes of all LED dies 220a-220d (and all additional LED dies not illustrated).

Warm-dimming lamps can be designed and constructed with filaments that embody the principles disclosed in FIGS. 2A, 2B, 3A, and 3B. Such lamps will have at least two LED arrays (or circuits) in parallel, each array having multiple LED dies, where at least one of the arrays is a first channel LED array, and at least another one of the arrays is a second channel LED array. The following nomenclature will be used in describing such lamps: "a" will be the number of arrays or circuits in parallel; "m" will be the number of first LED dies in the first channel LED array, and "n" will be the number of LED dies in the second channel LED array. As previously noted, there are at least two parallel LED arrays; therefore a≥2. Each first channel LED array has at least two LED dies; therefore, m≥2, where m is a constant for each specific embodiment. Each second channel LED array has less LED dies than the first channel; therefore, n<m, where n is also a constant for each specific embodiment. As will be understood and further described, because the second channel LED array has fewer LED dies than the first channel LED array, the forward voltage drop in a first channel LED array ($V_{f1}$) is greater than the forward voltage drop in a second channel LED array ($V_{f2}$), $V_{f1} > V_{f2}$. Because the forward voltage drop of the LED second channel LED array is less than the forward voltage drop of the first channel LED array, once powered, the LED dies of the second channel LED array will illuminate before the LED dies of the first channel LED array. In some alternative embodiments, devices other than LED dies may be included in the first channel array to cause $V_{f1}$ to initially exceed $V_{f2}$.

A current regulator, such as current regulator 315, is added in series with the LED dies of each second channel LED array. The current regulator may be for example a linear constant current integrated circuit, a semiconductor constant current device such as a constant current diode, a resistive component such as a resistor, or other non-light-emitting components. The current regulator 315 may function as a resistor in the second channel LED array.

In another embodiment of a LED lamp, a third LED array can be added in parallel to the first and second channel LED arrays. This additional LED array can be referred to as a third channel LED array. In one embodiment, the third channel LED array has: (i) a forward voltage drop ($V_{f3}$) that is less than the forward voltage drop in the first and second channel LED array, ($V_{f3} < V_{f2} < V_{f1}$), and (ii) includes a current regulator similar to the second channel LED array, such as current regulator 315. The lower forward voltage drop can be accomplished, for example, by the third channel LED array having fewer LED dies than the first or second channel LED arrays. In such a configuration, the third channel LED array will illuminate preferentially before the second channel LED arrays and first channel LED array, in a manner similar to that discussed above with reference to the first and second channel LED arrays. Additional channels may be similarly added to the LED lamp.

Figure 4A:
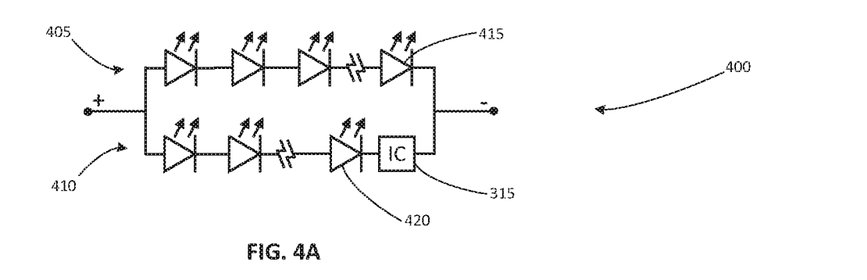
FIG. 4A illustrates a circuit diagram of LED arrays of an LED filament lamp according to one embodiment of the invention.

FIG. 4A illustrates a circuit diagram view of an LED load 400 of an LED filament lamp with two parallel LED arrays (a=2) according to one embodiment of the invention. The parallel LED arrays include a first channel LED array 405 and a second channel LED array 410. First channel LED array 405 has a plurality of LED dies in series, $FCD_1$ through $FCD_m$ (general reference no. 415 in figures). Second channel LED array 410 also has a plurality of LED dies in series, $SCD_1$ through $SCD_n$ (general reference no. 420 in figures). Additionally, the second channel LED array 410 includes a current regulator 315 in series with the LED dies 420. The terminals of the LED load 400 are connected to a standard single channel dimmable LED driver circuit (not illustrated). As previously described, the number of LED dies, m, in the first channel LED array 405 is greater than the number of LED dies, n, in the second channel LED array 410 (m>n).

Figure 4B:
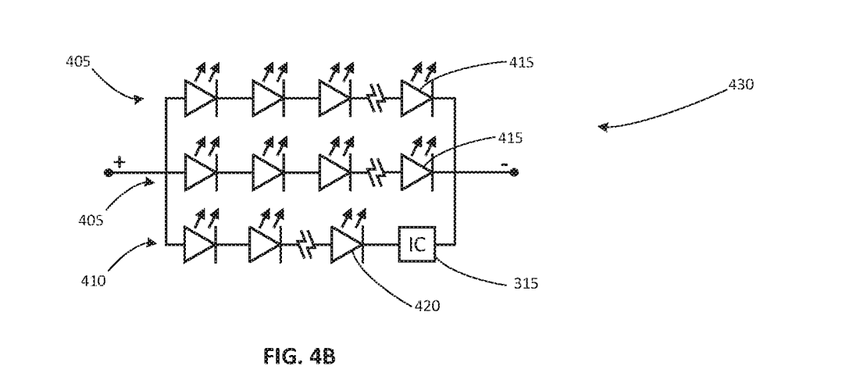
FIG. 4B illustrates a circuit diagram of LED arrays of an LED filament lamp according to another embodiment of the invention.

FIG. 4B illustrates a circuit diagram view of an LED load 430 of an LED filament lamp with three parallel LED arrays (a=3) according to one embodiment of the invention. The parallel LED arrays include two first channel LED arrays 405 and a single second channel LED array 410. Each first channel LED array 405 has a plurality of LED dies in series, $FCD_1$ through $FCD_m$ (general reference no. 415 in figures). Second channel LED array 410 also has a plurality of LED dies in series, $SCD_1$ through $SCD_n$ (general reference no. 420 in figures). Additionally, second channel LED array 410 includes a current regulator 315 in series with the LED dies 420. The terminals of the LED load 430 are connected to a standard single channel dimmable LED driver circuit (not illustrated).

Figure 4C:
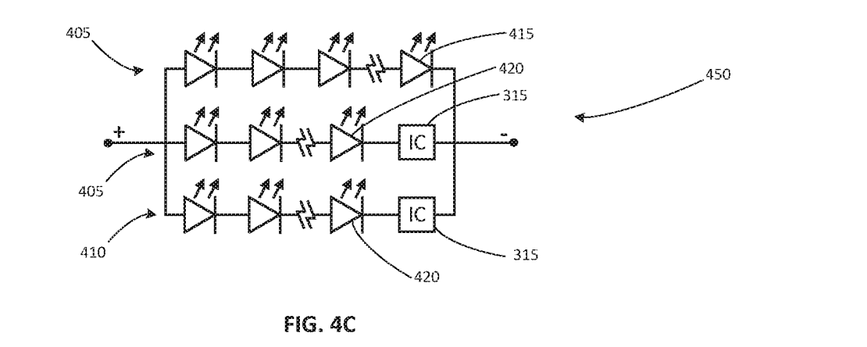
FIG. 4C illustrates a circuit diagram of LED arrays of an LED filament lamp according to another embodiment of the invention.

FIG. 4C illustrates a circuit diagram view of an LED load 450 of an LED filament lamp that also has three parallel LED arrays (a=3) according to one embodiment of the invention. However, the parallel LED arrays include a first channel LED array 405 and two second channel LED arrays 410. The first channel LED array 405 has a plurality of LED dies in series, $FCD_1$ through $FCD_m$ (general reference no. 415 in figures). Each second channel LED array 410 also has a plurality of LED dies in series, $SCD_1$ through $SCD_n$ (general reference no. 420 in figures). Additionally, each second channel LED array 410 includes a current regulator 315 in series with the LED dies 420. The terminals of the LED load 450 are connected to a standard single channel dimmable LED driver circuit (not illustrated).

Figure 4D:
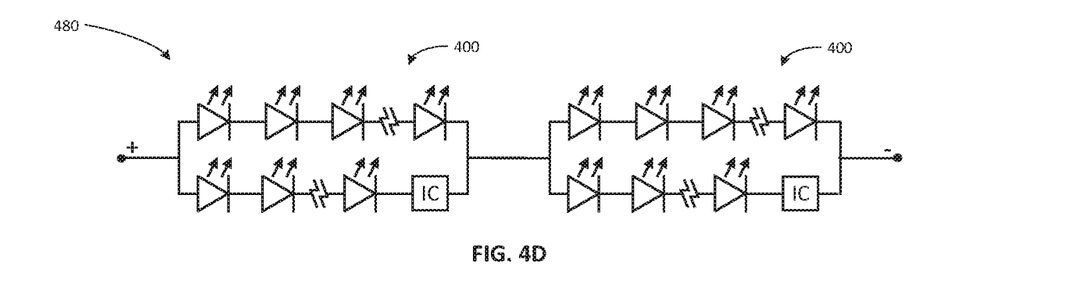
FIG. 4D illustrates a circuit diagram of the LED arrays of an LED filament lamp according to another embodiment of the invention.

Parallel LED arrays can also achieve a two-channel dimming function when placed in series. FIG. 4D illustrates a circuit diagram view of an LED load 480 of an LED filament lamp that combines of pair of LED loads 400, as illustrated in FIG. 4A. The pair of LED loads 400 are connected in series as illustrated in FIG. 4D. The terminals of the LED load 480 are connected to a standard single channel dimmable LED driver circuit (not illustrated).

In each of FIG. 4A-4D, the first channel LED arrays 405 may include one or more LED filaments 205 as previously described. The second channel LED arrays 410 includes at least one current-regulated LED filament 305, and may include one or more LED filaments 205 as previously described. Note also that the current regulator 315 need not be at any particular point in the series of the second channel LED arrays 410, as long as the current regulator 315 is in series within the second channel LED array 410. In some embodiments, in the first channel LED arrays 405 or the second channel LED arrays 410, the LED dies can be connected in parallel, rather than in series, provided the current regulator remains placed in series with the dies.

Figure 5A:
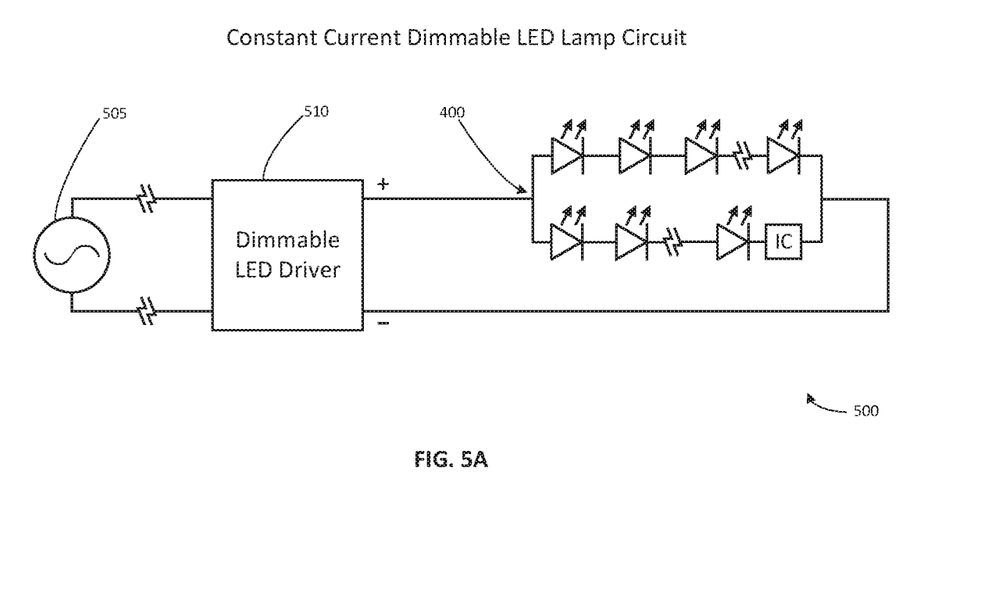
FIG. 5A illustrates a circuit diagram view of a constant current dimmable LED filament lamp according to one embodiment of the invention.

A standard single-channel dimmable LED driver circuit may be either a constant current dimmable LED driver circuit or a linear dimmable LED driver circuit, connected as appropriate to a power supply and to an LED load such as those illustrated in FIGS. 4A-4D. FIG. 5A illustrates a circuit diagram view of a constant current dimmable LED filament lamp 500, according to one embodiment of the invention. In the constant current dimmable lamp 500, dimmable LED driver circuit 505 may be a switched mode power supply such a buck-boost converter. Dimmable LED driver 505 is connected to an alternating current power source 510, and LED load 400 (illustrated, or other LED loads, such as for example LED loads 430, 450, and 480) is connected across the positive and negative terminals of Dimmable LED driver circuit 505. Here, the voltage drop across LED load 400 (or 430, 450, or 480) may be less than the line voltage of the alternating current power source 510.

Figure 5B:
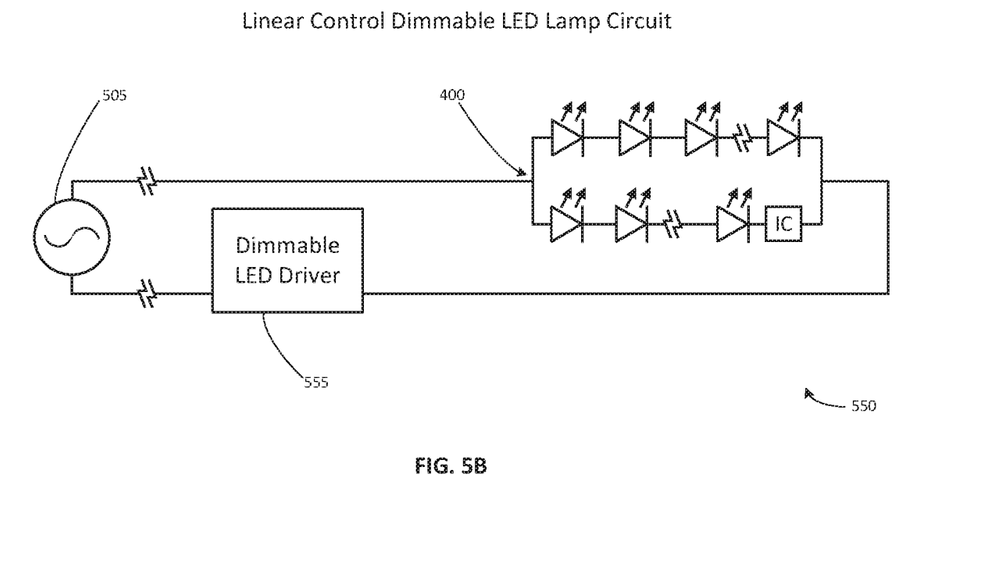
FIG. 5B illustrates a circuit diagram view of a linear control dimmable LED filament lamp according to one embodiment of the invention.

FIG. 5B illustrates a circuit diagram view of a linear control dimmable LED filament lamp 550, according to one embodiment of the invention. In the linear control dimmable LED filament lamp 550, dimmable LED driver circuit 555 is connected in series with the LED load 400 (illustrated, or other LED loads, such as for example LED loads 430, 450, and 480) between the terminals of alternating current power source 510. As illustrated in FIG. 5B, the voltage drop across LED load 400 (or 430, 450, or 480) should be at least approximately the line voltage of the alternating current power source 510.

In both constant current dimmable lamp 500 and linear control dimmable lamp 550, a reduction in power supplied by alternating current power source 510 reduces current through the LED load 400 (or 430, 450, or 480). Similarly, an increase in power supplied by alternating current power source 510 increases current through the LED load 400 (or 430, 450, or 480). Such decrease or increase in power from alternating current power source 510 may be due, for example, to pulse width modulation dimming or sine wave dimming. Commonly, such a method is implemented by a household dimming circuit, such as what is referred to in the industry as a TRIAC dimmer. Although TRIAC dimmers are typically designed for incandescent and/or halogen lamps and/or not compatible with typical LED lamps, the novel LED filaments and LED lamps disclosed herein are compatible with such TRIAC dimmers.

For the various embodiments disclosed herein, including but not limited to the embodiments described with reference to FIGS. 4A-4D, 5A-5B, when the power supplied to the LED lamp is relatively low, the current flowing through the LED load is low. The various embodiments can include one or more first channel LED arrays and one or more second channel LED arrays. The forward voltage drop in a second channel LED array(s) is less than the forward voltage drop in a first channel LED array(s) ($V_{f2} < V_{f1}$), so at low current, the current flows preferentially through the second channel LED array(s). This causes the second channel LED array(s) to illuminate before the first channel LED array(s).

As the power supplied to the LED lamp is increased, the current continues to preferentially flow through the second channel LED array(s). This causes the second channel LED array(s) to brighten while the first channel LED array(s) remain unilluminated. The increasing current flowing through the second channel LED array(s) also causes the current regulator(s) to increase the total forward voltage drop ($V_{f2}$) of second channel LED array(s).

Once the total forward voltage drop ($V_{f2}$) of each second channel LED array reaches total forward voltage drop ($V_{f1}$) of each first channel LED array ($V_{f2} = V_{f1}$), the output current of the LED driver circuit begins to flow through the first channel LED arrays. This causes the LED dies of the first channel LED array(s) to illuminate. This transition may be gradual, commencing as the total forward voltage drop ($V_{f2}$) of each second channel LED array approaches the total forward voltage drop ($V_{f1}$) of each first channel LED array, and potentially continuing even as $V_{f2}$ slightly exceeds $V_{f1}$.

As the power supplied to the LED driver circuit is further increased, the output current of the LED driver circuit flowing through the first channel LED array(s) increases, but the output current of the LED driver circuit flowing through the second channel LED array(s) does not increase. The current flow through the second channel LED array(s) is held relatively constant by the current regulator, because further increase of current would increase the total forward voltage drop ($V_{f2}$) of each second channel LED array beyond the total forward voltage drop ($V_{f1}$) of each first channel LED array ($V_{f2} > V_{f1}$). This causes the first channel LED array(s) to continue to brighten while the second channel LED array(s) remain at their full illumination. This process continues until the power supplied to the LED driver circuit reaches its maximum. Reducing the power supplied to the LED driver circuit reverses this process, with the LED dies of the first channel LED array(s) dimming down to an unilluminated state followed by the dimming of the LED dies of the second channel LED array(s) to an unilluminated state as the power is gradually reduced.

First channel LED arrays may be constructed of one or more LED filaments 205 that are to emit light with a mid-range correlated color temperature, for example 4000 Kelvin. Second channel LED arrays are constructed of one or more current-regulated LED filaments 305 and, optionally, one or more LED filaments 205. Such second channel LED arrays can be configured to emit light with a warm correlated color temperature, for example, 1800 Kelvin. Other color temperatures may be appropriate; however, to achieve a desired warm dimming effect, the second channel LED arrays should emit light that is warmer than the light emitted by the first channel LED arrays.

The correlated color temperature of the aggregate light emitted from all filaments in a LED lamp with warm dimming effect can be adjusted by selecting the ratio of warm filaments to cool filaments. For example, ratio of four 4000 Kelvin filaments to two 1800 Kelvin filaments provides an aggregate light of approximately 3200 Kelvin, when both channels are at full intensity. Such a correlated color temperature is a bright warm white similar to that given off by a halogen incandescent lamp. Accordingly, as the power to the LED driver circuit is reduced, the 4000 Kelvin first channel LED arrays dim first, causing the aggregate light to warm toward the 1800 Kelvin emitted by the second channel LED arrays. Once the 4000 Kelvin first channel LED arrays are in an unilluminated state, all light comes from the 1800 Kelvin second channel LED arrays until the minimum intensity is reached. Thus, a warm dimming effect occurs without the use of a two-channel dimmable LED driver circuit. Such a LED lamp with warm dimming effect uses a standard single-channel dimmable LED driver circuit, with only two conductive leads between the driver and the terminals of the LED arrays. Thus, such a LED lamp is easy to install, does not require complicated accessories or internal components, and provides consumers with an economical option for a warm dimming LED lamp.

Illustrative embodiments have been described, hereinabove. It will be apparent to those skilled in the art that the above devices and methods may incorporate changes and modifications without departing from the general scope of this invention. It is intended to include all such modifications and alterations within the scope of the present invention. Furthermore, to the extent that the term "includes" is used in either the detailed description or the claims, such term is intended to be inclusive in a manner similar to the term "comprising" as "comprising" is interpreted when employed as a transitional word in a claim.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

To the extent that the phrase "at least one of" is used in the specification or claims followed by more than one item, the phrase is intended to mean one of the items, or a combination of more than one of the items, or all of the items. For example, the phrase "at least one of A, B, and C" means: "A, B, C, A and B, A and C, B and C, or A and B and C."

To the extent that the term "or" is used in the specification or claims followed by two or more items, the term is intended to mean any one of the items, any combination of more than one of the items, or all of the items. For example, "A or B" means: "A or B or both." When the applicants intend to indicate any one of the items, but no combination of more than one of the items, then the applicants will expressly so indicate. For example, if the applicants intend to indicate "only A or B but not both" then the phrase "only A or B but not both" will be used. Thus, use of the term "or" herein is the inclusive, and not the exclusive use.

What is claimed is:

1. An LED filament lamp, comprising:
   a dimmable LED driver circuit;
   a first channel LED array with at least two LED die and a first forward voltage drop; and
   a second channel LED array with at least one LED dies and at least one current regulator to cause a second forward voltage drop of the second channel LED array to increase as current through the second channel LED array increases, wherein the second channel LED array is connected in parallel with the first channel LED array and the first channel LED array and second channel LED array that are connected in parallel are connected in series directly between an alternating current source and a terminal of the dimmable LED driver circuit.

2. The LED filament lamp of claim 1, wherein the second forward voltage drop is lower than the first forward voltage drop when the current between the terminal of the dimmable LED driver circuit and the alternating current source is low, to cause illumination of the at least one LED die of second channel LED array.

3. The LED filament lamp of claim 1, wherein the second forward voltage drop is greater than or equal to the first forward voltage drop when the current between the terminal of the dimmable LED driver circuit and the alternating current source is high, to cause illumination of the at least two LED dies of the first channel LED array in addition to the illumination of the at least one die of the second channel LED array.

4. The LED filament lamp of claim 1, wherein the at least two LED dies of the first channel LED array emits a light of a correlated color temperature that is different from the correlated color temperature of light emitted by the at least one LED die of the second channel LED array.

5. The LED filament lamp of claim 1, wherein the at least two LED dies of the first channel LED array emits a light of a correlated color temperature that is higher than the correlated color temperature of light emitted by the at least one LED die of the second channel LED array.

6. The LED filament lamp of claim 1, further comprising:
   at least one filament substrate, wherein the at least one current regulator and at least one LED die of the second channel LED array are mounted on the filament substrate.

7. The LED filament lamp of claim 1, wherein the filament substrate is a ceramic substrate, a glass substrate, a sapphire substrate, a metal substrate, or a substrate combining two or more of the foregoing materials.

8. The LED filament lamp of claim 1, further comprising:
   an additional first channel LED array with at least two LED dies connected between the terminal of the dimmable LED driver circuit and the alternating current source, wherein the additional first channel LED array has the first forward voltage drop to cause the at least two LED dies of the additional first channel LED array to dim synchronously with the at least two LED dies of the first channel LED array.

9. The LED filament lamp of claim 1, further comprising:
   an additional second channel LED array with at least one LED die connected between the terminal of the dimmable LED driver circuit and the alternating current source, wherein the additional second channel LED array has the second forward voltage drop to cause the at least one LED die of the additional second channel LED array to dim synchronously with the at least one LED die of the second channel LED array.

10. The LED filament lamp of claim 1, further comprising:
    a first filament substrate, wherein the first channel LED array is mounted on the first filament substrate;
    a first adhesive bead with fluorescent particles suspended therein affixed to the first filament substrate, wherein illuminating the fluorescent particles with the first channel LED array causes emission of first light having a first correlated color temperature;
    a second filament substrate, wherein the second channel LED array is mounted on the second filament substrate; and
    a second adhesive bead with fluorescent particles suspended therein affixed to the second filament substrate, wherein illuminating the fluorescent particles with the first channel LED array causes emission of second light having a second correlated color temperature that is warmer than the first light.

11. An LED filament lamp, comprising:
    a dimmable LED driver circuit having a positive terminal and a negative terminal;
    a first channel LED filament including a first series of first LED dies mounted on a first light-transmissive substrate under a first adhesive bead with first fluorescent particles suspended within the first adhesive bead, wherein illuminating the first fluorescent particles with the first LED dies causes the first channel LED filament to emit first light of a relatively cooler correlated color temperature;
    a second channel LED filament including a second series of second LED dies and a current regulator mounted on a second light transmissive substrate under a second adhesive bead with second fluorescent particles suspended within the second adhesive bead, wherein illuminating the second fluorescent particles with the second LED dies causes the second channel LED filament to emit second light of a relatively warmer correlated color temperature;
    wherein the first channel LED filament is connected in parallel with the second channel LED filament across the positive terminal and the negative terminal of the dimmable LED driver circuit.

12. The LED filament lamp of claim 11, wherein:
    the first channel LED filament has a first forward voltage drop;
    the current regulator is configured to cause a second forward voltage drop of the second channel LED filament to increase as current through the second channel LED filament increases;
    the second forward voltage drop is lower than the first forward voltage drop when the current between the positive terminal and the negative terminal is low, to cause the second channel LED filament array to emit the second light of the relatively warmer correlated color temperature; and
    the second forward voltage drop is greater than or equal to the first forward voltage drop when the current between the positive terminal and negative terminal is high, to cause the first channel LED filament to emit the first light of the relatively cooler correlated color temperature in addition to the warmer light from the second channel LED filament.

13. The LED filament lamp of claim 11, wherein the light-transmissive substrate is a substrate with through holes or a fiberglass substrate.

14. The LED filament lamp of claim 11, wherein the first fluorescent particles cause the first channel LED filament to emit the first light with a correlated color temperature in the range of 4000 Kelvin to 5000 Kelvin.

15. The LED filament lamp of claim 11, wherein the second fluorescent particles cause the second channel LED filament to emit the second light with a correlated color temperature of approximately 1800 Kelvin.

16. An LED filament lamp, comprising:
a dimmable LED driver circuit;
a first channel LED array with at least two LED die and a first forward voltage drop;
a second channel LED array with at least one LED dies and at least one current regulator to cause a second forward voltage drop of the second channel LED array to increase as current through the second channel LED array increases, wherein the second channel LED array is connected in parallel with the first channel LED array;
a first filament substrate, wherein the first channel LED array is mounted on the first filament substrate;
a first adhesive bead with fluorescent particles suspended within the first adhesive bead affixed to the first filament substrate, wherein illuminating the fluorescent particles with the first channel LED array causes emission of first light having a first correlated color temperature;
a second filament substrate, wherein the second channel LED array is mounted on the second filament substrate; and
a second adhesive bead with fluorescent particles suspended within the second adhesive bead affixed to the second filament substrate, wherein illuminating the fluorescent particles with the first channel LED array causes emission of second light having a second correlated color temperature that is warmer than the first light.

17. The LED filament lamp of claim 16, wherein the parallel first channel LED filament and the second channel LED filament are connected across a positive terminal of the dimmable LED driver circuit and a negative terminal of the dimmable LED driver circuit.

18. The LED filament lamp of claim 16, wherein the parallel first channel LED filament and second channel LED filament are connected in series between an alternating current source and a terminal of the dimmable LED driver circuit.

19. The LED filament lamp of claim 16 further comprising an additional first channel LED filament.

20. The LED filament lamp of claim 16 further comprising additional first channel LED filaments and additional second channel LED filaments, wherein the number of first channel LED filaments and the number second channel LED filaments are selected to provide an bright warm light having an aggregate correlated color temperature of approximately 3200 Kelvin when both channels are at full intensity.

* * * * *